United States Patent [19]

Pavio

[11] 4,125,810
[45] Nov. 14, 1978

[54] BROADBAND HIGH FREQUENCY BALUNS AND MIXER

[75] Inventor: Anthony M. Pavio, Denver, Colo.

[73] Assignee: Vari-L Company, Inc., Denver, Colo.

[21] Appl. No.: 785,858

[22] Filed: Apr. 8, 1977

[51] Int. Cl.² .......................... H04B 1/26; H03H 7/42
[52] U.S. Cl. .................................... 325/446; 325/449; 333/26; 333/34; 333/84 M
[58] Field of Search ............... 333/26, 84 R, 84 M, 333/33, 34, 97, R; 325/445, 446, 449; 363/157, 158

[56] References Cited

U.S. PATENT DOCUMENTS

| | | | |
|---|---|---|---|
| 3,419,813 | 12/1968 | Kamnitsis | 333/34 |
| 3,523,260 | 8/1970 | Gunshinan et al. | 333/26 |
| 3,652,941 | 3/1972 | Neuf | 333/34 |
| 3,678,395 | 7/1972 | Hunton et al. | 325/446 |
| 3,678,418 | 7/1972 | Woodward | 333/26 |
| 3,735,267 | 5/1973 | Napoli | 325/446 |
| 3,784,933 | 1/1974 | Scherer et al. | 333/26 |
| 4,063,176 | 12/1977 | Milligan et al. | 325/446 |

Primary Examiner—Robert L. Richardson
Assistant Examiner—Jin F. Ng
Attorney, Agent, or Firm—Ancel W. Lewis, Jr.

[57] ABSTRACT

A double slot balun has two pairs of coplanar, electric conductive sheets in a superposed, spaced, electrically insulated relation on opposite planar surfaces of a dielectric substrate forming two slots disposed in spaced, parallel planes. Unbalanced signals applied simultaneously to common ends of the slots result in balanced in-phase signals at the opposite end of the two slots. A constant impedance balun has two alined, electric conductive strips in a superposed, spaced, electrically insulated relation mounted on opposite planar surfaces of a dielectric substrate with the widths at opposite ends of each conductive strip being chosen for selected parallel-plate impedance characteristics and one conductive strip having a selected taper, preferably following a cosine curve, while the width of the other conductive strip is selected relative to the cosine taper along its length to provide a constant impedance at any point along the length of the two conductive strips. A broadband mixer has a common dielectric substrate with a double slot balun associated with an RF signal port and two of the constant impedance baluns associated with the LO signal port and in turn these baluns are interconnected with a double balanced bridge arrangement having two separate rings of matched diodes with no crossover connections between the baluns or between the baluns and the diodes.

27 Claims, 27 Drawing Figures

BROADBAND HIGH FREQUENCY BALUNS AND MIXER

FIELD OF THE INVENTION

The present invention relates to electric devices for transferring electric signals between a variety of electric devices over a wide range of frequencies and particularly broadband microwave devices for communication, telemetry signal processing applications, and the like.

BACKGROUND OF THE INVENTION

There are numerous system applications and particularly modern microwave systems which require narrowband perfection with broadband versatility. In U.S. Pat. No. 4,063,176, assigned to the assignee of the present invention, there is shown and described a broadband mixer using tapered ground plane microstrip transmission line baluns. The present invention discloses other forms of novel transmission line baluns and a mixer using these baluns also having extremely good performance characteristics that are usable in many system applications including airborne and marine ECM and communications equipment, satellite earth station transmitters and receivers, overland microwave communication links, as well as phase-locked sources, broadband sweepers, and heterodyne frequency counters.

Accordingly, it is an object of the present invention to provide novel and improved ultra-high bandwidth transmission line baluns.

Another object of the present invention is to provide high performance, relatively small size, lightweight, durable transmission line baluns that are usable in a variety of modern system applications.

Yet another object of the present invention is to provide a double slot balun characterized by an extremely wide frequency response, adjustable impedance transformation, a low voltage standing wave ratio and electromagnetic field distribution in a substantially planar direction.

Still another object of the present invention is to provide a double slot balun principally characterized by two separate pairs of coplanar conductive sheets in a spaced, superposed and electrically insulated relation to one another to form two slots in a spaced, parallel relation with parallel conductive sheets having the same polarities when alternating electric energy is applied to one end of the slots.

A further object of the present invention is to provide a constant impedance balun characterized by an extremely wide bandwidth, a one-to-one impedance transformation, low voltage standing wave ratios, and good performance down to the frequency corresponding to the one-eighth wavelength point.

Yet a further object of the present invention is to provide a constant impedance transmission line balun principally characterized by two alined, spaced, parallel conductive strips electrically insulated from one another with one conductive strip tapered with a selected taper and the other conductive strip adjusted relative to the selected taper to provide a constant impedance at any point along the conductive strips taken at any cross section that is perpendicular to the center lines of the two conductive strips.

Still a further object of the present invention is to provide a novel broadband mixer using transmission line baluns that has extremely wide bandwidth characteristics, low conversion losses, low voltage standing wave ratios, and good isolation between ports.

Other objects, advantages and capabilities of the present invention will become more apparent as the description proceeds, taken in conjunction with the accompanying drawings in which like parts have similar reference numerals and in which:

Double Slot Balun

The double slot balun shown in FIGS. 1-6 is generally designated by numeral 10. This balun 10 shown comprises a generally rectangular-shaped dielectric substrate 11 having two opposed, spaced, smooth, planar surfaces, herein referred to as the top surface 12 and the bottom surface 13. It is understood that the terms "top" and "bottom" are used as they are normally positioned during operation but the device will operate with either of these flat surfaces disposed up or down.

A generally rectangular-shaped, thin, electric conductor or electric conductive sheet 15 is mounted on and affixed to the top surface of the substrate 11 at one end thereof and this sheet is herein referred to as the first conductive sheet. Another generally rectangular, thin, electric conductor or electric conductive sheet 16 is mounted on and affixed to the top surface of the substrate 11, herein referred to as the second conductive sheet. The first and second conductive sheets 15 and 16 are separated or spaced a selected distance along opposed longitudinal edges 17 and 18, respectively, defining a slot 19, herein referred to as the first slot. These conductive sheets 15 and 16 cover the entire top surface of the substrate 11 except for the slot 19. Since the first and second conductive sheets are mounted on the same top surface of the substrate, they are in a coplanar arrangement or relationship.

On the bottom surface 13 of the substrate 11 there is mounted and affixed a generally rectangular-shaped, thin, electric conductor or electric conductive sheet 22 that is in a spaced, superposed, parallel relation opposite the first conductive sheet 15 and is of a corresponding size and shape with the sheet so as to be substantially a mirror image thereof as viewed in plan. This conductive sheet 22 is herein referred to as the third conductive sheet and is in a spaced, parallel, electrically insulated relation to the first conductive sheet 15. Finally, there is mounted a generally rectangularly shaped, thin, electric conductor or electric conductive sheet 23 directly opposite the second conductive sheet 16, herein referred to as the fourth conductive sheet, which is of a corresponding size and shape with that of the second conductive sheet 16 so as to be substantially a mirror image thereof as viewed in plan.

The third and fourth conductive sheets 22 and 23 are in a coplanar relation with one another and are separated or spaced from one another along opposed longitudinal edges 24 and 25, respectively, defining a slot 26, herein referred to as the second slot. These four conductive sheets forming the first and second slots and separated by the dielectric substrate or electric insulation serve as a double slot transmission line balun. The slots 19 and 26 each are shown as of uniform width throughout their lengthwise extent and are of a corresponding size and shape to provide a transformation ratio of about one-to-one. These slots, however, may be tapered to change the energy transformation ratio, as described more fully hereinafter.

The width dimension of the conductive sheets 15, 16, 22 and 23 is relatively wide as compared to the width of the slots 19 and 26 formed thereby. The width dimension of the conductive sheets preferably is at least one-half wavelength for the lowest frequencies of the contemplated electromagnetic energy to be applied to the balun 10.

The end portions of sheets 15 and 16 at one end of the slot 19 provide a pair of terminals designated by numerals 1 and 2, respectively. These terminals 1 and 2 are herein designated as input terminals and are herein referred to as the unbalanced end or the end to which unbalanced input signals are applied. The end portions of sheets 15 and 16 at the opposite end of slot 19 provide a pair of terminals designated by numerals 3 and 4, respectively. Terminals 3 and 4 are herein designated as output terminals and are herein referred to as the balanced end or the end from which balanced output signals are taken. It is understood, however, that, since the balun 10 shown is symmetrical in construction and reversible in operation, the output terminals 3 and 4 could serve as input terminals and vice versa with the same unbalanced-to-balanced transformation results in operation.

In a like manner the end portions of sheets 22 and 23 at one end of the second slot 26 provide a pair of terminals designated by numerals 1' and 2', respectively. Terminals 1' and 2' are herein referred to as input terminals and are at the unbalanced end. The end portions of sheets 22 and 23 at the opposite end of slot 26 provide a pair of terminals designated by 3' and 4', respectively, herein referred to as output terminals and are at the balanced end.

In the operation of the above described double slot transmission line balun 10, when an unbalanced signal is applied to one end of slot 19 via terminals 1 and 2, it is transformed by the balun to a balanced signal at terminals 3 and 4. In a like manner, when an unbalanced signal is applied to one end of slot 26 via terminals 1' and 2', it is transformed by the balun to a balanced signal at terminals 3' and 4'. In practice the unbalanced input signals that are applied simultaneously to terminals 1 and 2 and to terminals 1' and 2' and the balanced output signals that appear at terminals 3 and 4 and at terminals 3' and 4' are in phase with one another. The polarity and field distribution for the two pairs of coplanar sheets is shown by arrows and plus and minus signs in FIGS. 4 and 5 for one portion of the AC cycle of the electromagnetic energy being applied. When conductive sheet 15 is positive, conductive sheet 12 in coplanar relation thereto is negative with the flux field being substantially planar in nature and flowing from the longitudinal edge 17 to longitudinal edge 18 as shown by arrows. At the same time, when conductive sheet 15 is positive the conductive sheet 22, which is in a spaced parallel relation thereto, is positive and the conductive sheet 23 in coplanar relation to conductive sheet 22 is negative. The field or flux flow from sheet 23 to sheet 22 again is substantially coplanar as shown by arrows. During the next half cycle the polarities of course will reverse, but again there are like polarities on the spaced, parallel conductive sheets and unlike polarities on the coplanar conductive sheets.

Figure 1:
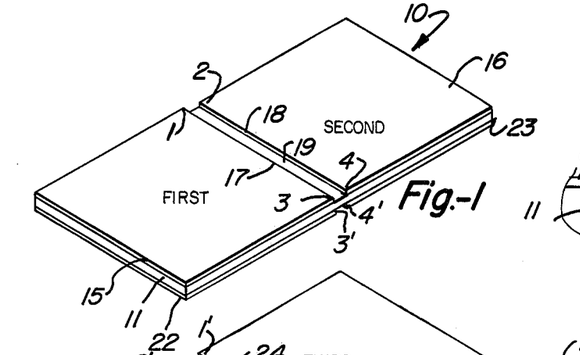
FIG. 1 is a top perspective view of a double slot balun embodying features of the present invention.
Figures 2, 3, 5, 6, 7, 8:
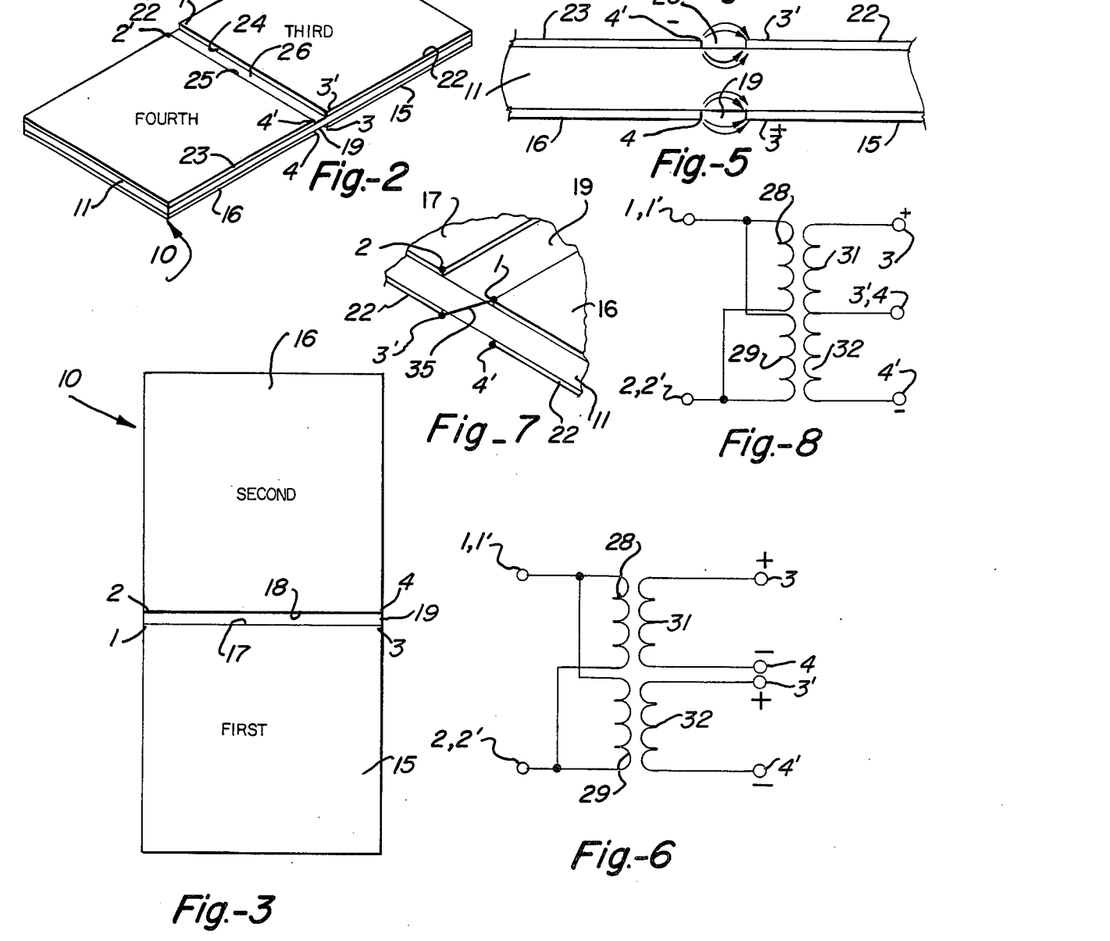
FIG. 2 is a bottom perspective view of the balun shown in FIG. 1.
FIG. 3 is a top plan view of the balun shown in FIG. 1.
FIG. 5 is an end elevational view of a central portion of the balun with the bottom facing up as shown in FIG. 2 and looking toward the balanced end.
FIG. 6 is an equivalent circuit diagram for the balun shown in FIG. 1-5.
FIG. 7 is a fragment of the double slot transmission line balun shown in FIG. 1 looking toward the balanced end with diagonally opposed conductive sheets electrically connected together.
FIG. 8 is an equivalent circuit diagram for the double slot balun connected as shown in FIG. 7.
Figure 4:
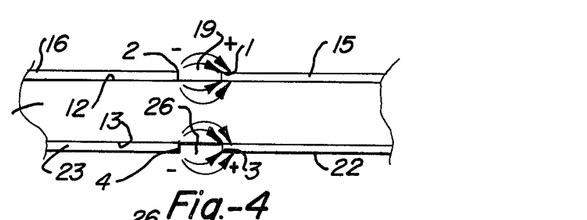
FIG. 4 is an end elevational view of a central portion of the balun of FIGS. 1-3 looking toward the unbalanced end.

The equivalent electric circuit for the double slot balun 10 illustrated in FIG. 6 has a primary winding 28 connected between terminals 1 and 2 and a primary winding 29 connected between terminals 1' and 2'. The effect of launching the wave in the structure is to electrically superimpose points 1 and 1' and points 2 and 2' so they are shown connected together in the equivalent circuit. These primary windings 28 and 29 are each inductively coupled to a secondary winding 31 connected between terminals 3 and 4 and also to a secondary winding 32 connected between terminals 3' and 4'. The polarities of terminals 1, 1', 2, 2', 3, 3', 4 and 4' of the equivalent circuit transformer relate to those designated on the physical structure in FIGS. 4 and 5.

Referring now to FIGS. 7 and 8, the second and third conductive sheets 16 and 22 are shown electrically connected together at one end of the slot by an electric conductor 35. The input or output electric signals then are applied to or taken from the first and fourth conductive sheets. This configuration provides a center tapped, balanced structure having an equivalent circuit as shown in FIG. 8. Terminals 3 and 4' are the ends of the secondary windings and terminals 3' and 4 are a center tap.

Constant Impedance Balun

The constant impedance balun 40 shown in FIGS. 9-14 comprises a dielectric substrate 41 having two opposed, relatively broad, smooth, planar surfaces, herein referred to as the top surface 42 and the bottom surface 43. Again, the top and bottom surface designations relate to the usual disposition thereof, but it is understood that this is not intended as a limitation since either may face up or down and this would not affect the operation of the balun 40.

A thin, flat electric conductor or electric conductive strip 45 is mounted on and affixed to the top surface 42 of the substrate. Strip 15 has a selected width at one end herein designated W1 and a selected width at the opposite end herein designated W2 with the width increasing along the strip from W1 to W2 according to a taper related to the taper of the bottom strip 46 described more fully hereinafter. This top conductive strip 45 is herein referred to as the first conductive strip and the end designated W1 is the unbalanced end to which unbalanced input signals are applied, while the end designated W2 is the balanced end from which unbalanced signals are taken.

The bottom electric conductor or electric conductive strip 46 is also thin and flat and is herein referred to as the second conductive strip and is affixed to the bottom face 43 of the substrate in a spaced, superposed, parallel relation opposite and alined with the conductive strip 45 as viewed in plan so that strips 45 and 46 have common longitudinal center lines. This second conductive strip 46 has a selected width at one end, herein designated W3, which is equal to the width of the end W2 and is also at the balanced end of the balun. The second conductive strip 46 has a selected width at end designated W4, which is opposite end W3, and W4 is the unbalanced end. This bottom conductive strip 46 is shown as being tapered along a cosine curve to gradually increase in width from the balanced end W3 to the unbalanced end W4. The cosine curve taper has been found to be particularly effective in providing an equal ripple highpass structure. The bottom conductive strip 46 at end W4 merges with a transverse, thin, flat, conductive ground plane strip 47.

Figures 9, 10, 11, 12, 13, 14, 15, 16:
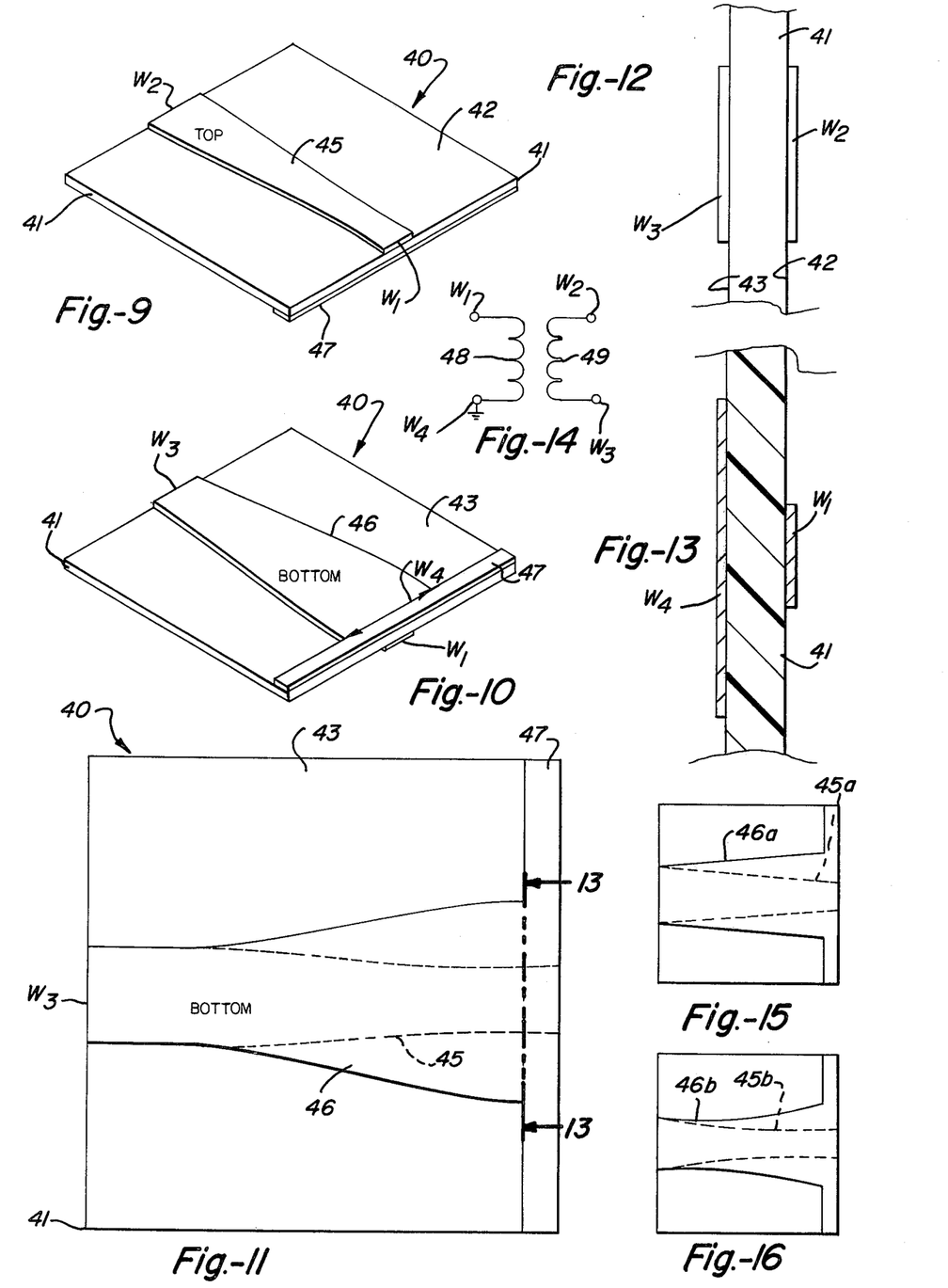
FIG. 9 is a top perspective view of a cosine taper constant impedance balun embodying features of the present invention.
FIG. 10 is a bottom perspective view of the balun shown in FIG. 9.
FIG. 11 is a bottom plan view of the balun shown in FIGS. 9 and 10.
FIG. 12 is an end view of a portion of the balun shown in FIG. 11 looking toward the balanced end.
FIG. 13 is a sectional view taken along lines 13—13 of FIG. 11 at the unbalanced end of the balun.
FIG. 14 is an equivalent circuit diagram for the constant impedance balun of FIGS. 10-13.
FIG. 15 is a bottom plan view of a straight taper constant impedance balun.
FIG. 16 is a bottom plan view of an exponential taper constant impedance balun.

In determining the widths of the ends of the first and second conductive strips of balun 40 above described, the width of end W1 is selected for a particular load to which it is connected, which typically is an unbalanced, planar, transmission line having a particular characteristic impedance. The width of end W2 is calculated for a balanced, parallel plate transmission line having the same characteristic impedance as that of the planar transmission line associated with end W1. The width of end W3 is the same as W2 and then the width W4 is selected so that widths W1 and W4 form a transmission line having that same characteristic impedance. The taper along the bottom conductive strip 46 between ends W3 and W4 is selected to widen toward end W2 and follows a cosine curve. As shown in FIGS. 10 and 11, this taper for the strip 46 is essentially one-half of a cosine curve. The points for the top conductive strip 45 between the ends W1 and W2 are determined after the bottom conductive strip 46 is laid out. Points along the top conductive strip 45 are selected in relation to the width of the bottom conductive strip 46 so that the top and bottom conductive strips have the same impedance at any point along the length thereof such that a cross section taken through the balun perpendicular to the center lines of the conductive strips would have the same impedance.

Referring now to FIG. 14, the constant impedance balun 41 has an equivalent circuit which is that of a transformer with a primary winding 48 between input ends or terminals W1 and W4 and a secondary winding 49 between output ends or terminals W2 and W3. The ends of the baluns are also properly referred to as terminals since these are the points at which electric energy is applied and taken.

While it has been found that the cosine curve taper for the bottom conductive strip 46 provides highly satisfactory results, it is understood that other tapers may be used. Other tapers would include a straight line taper 46a as illustrated in FIG. 15 or an exponential taper 46b as illustrated in FIG. 16. The taper of the corresponding top conductive strip 45a opposite 46a and the taper of the corresponding bottom conductive strip are adjusted according to the taper along the corresponding bottom conductive strip to provide constant impedance at any point along the length of the balun.

Broadband Mixer

Referring now to FIGS. 17-21, there is shown a broadband mixer circuit and related structure incorporating the features of the double slot balun and the constant impedance baluns previously described. In general, the broadband mixer circuit shown has a double slot balun 100 associated with a first signal port 53, two constant impedance baluns 140 and 240 associated with a second signal port 56, and a balun 57 associated with a third signal port 58, together with a frequency converter 59 interconnected between the baluns 100, 140, 240. In the broadband mixer circuit described herein, signal port 53 is suitable for operation in the frequency range of about 2 to 20 GHz and for purposes of identification is herein referred to generally as the first signal port 53, and is specifically referred to herein as the radio frequency or RF signal port because this signal port normally inputs or outputs a signal in the RF range.

The second signal port 56 is suitable for operation in the frequency range of about 2 GHz to 20 GHz and is generally referred to herein as the second signal port and is specifically referred to herein as the local oscillator or LO signal port. Signal port 58 is suitable for operation in the frequency range of about 5 MHz to 6 GHz and is herein referred to generally as the third signal port and specifically as the intermediate frequency or IF signal port. All three signal ports 53, 56 and 58 of the present invention are mutually interchangeable and may input or output a signal.

Figure 17:
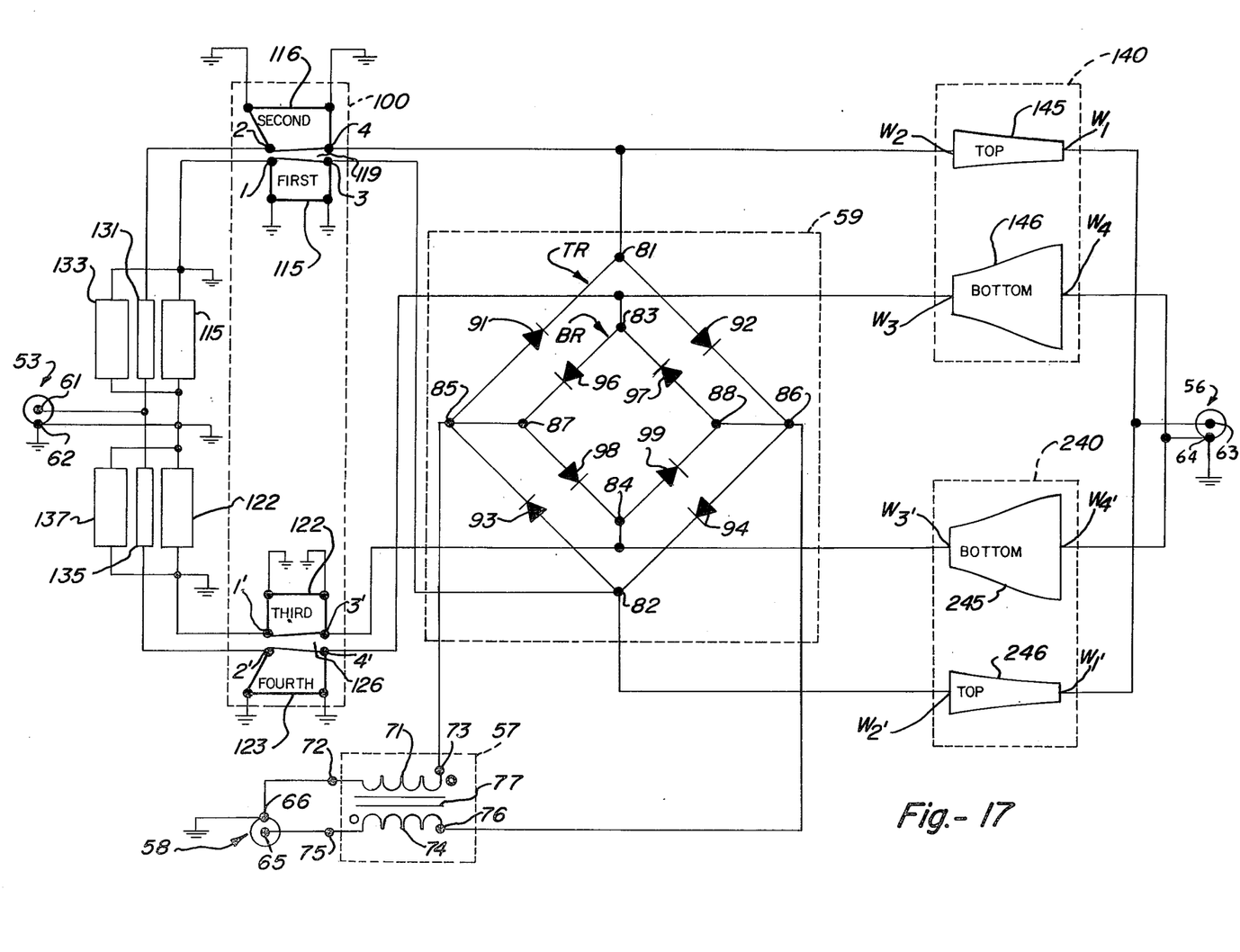
FIG. 17 is a schematic electric circuit diagram of a broadband mixer using the features of the baluns shown in FIGS. 1-16.

For purposes of identification and explanation of the mixer circuit, the RF signal port 53 in the circuit diagram of FIG. 17 is shown to have a pair of terminals 61 and 62 with terminal 62 being connected to ground, the LO signal port 56 is shown as having a pair of terminals 63 and 64 with terminal 64 connected to ground, and the IF signal port 58 has a pair of terminals 65 and 66 with terminal 66 connected to ground.

Balun 57 associated with signal port 58 is in the form of a transformer and has a winding 71 with terminals 72 and 73 at opposite ends thereof and a winding 74 with terminals 75 and 76 at opposite ends thereof. Windings 71 and 74 are wound on a core 77 so as to be inductively coupled. Terminals 73 and 76 are a terminal pair on the side of the balun opposite the IF signal port 58 and terminals 72 and 75 are a terminal pair on the IF signal port side of balun 57.

Terminal 72 is connected by a line to terminal 66 of the IF port which is at ground to connect one terminal on the IF port side to ground, and terminal 75 is connected by a line to terminal 65 of the IF signal port 58. In this arrangement a balanced IF signal is produced at terminals 73 and 76 and an unbalanced IF signal is produced at terminals 72 and 75 of balun 58 which in turn are electrically connected to terminals 66 and 65, respectively, of the IF signal port 57.

The entire mixer circuitry is mounted on a common dielectric substrate 111 having a planar top surface 112 and a planar bottom surface 113, the substrate serving to electrically insulate the coplanar conductive sheets from one another and the spaced parallel conductive strips from one another, as is the case with the substrates of the baluns above described.

The frequency converter 59, in general, is in the form of a double balanced bridge arrangement having two separate rings of matched diodes, there being shown in the schematic diagram an outer ring and an inner ring, each comprised of four diodes per ring. The outer ring of diodes is physically mounted on the top planar surface 112 of the dielectric substrate 111 and is herein designated TR, while the inner ring of diodes is physically mounted on the bottom planar surface 113 of the substrate and is herein designated BR. This converter has what is referred to herein for reference purposes as a set of terminals 81 and 82, a set of terminals 83 and 84 or sets of terminals associated with the RF signal port and the LO signal port. The diode rings TR and BR are connected together at terminals shown schematically in FIG. 17 as two terminals 85 and 87 electrically connected by a line and two terminals 86 and 88 electrically connected by a line to correspond with the structure described hereinafter.

The outer or top ring TR of the frequency converter 59 includes a pair of matched non-linear devices in the form of diodes 91 and 92 between terminal 81 and terminals 85 and 86 and a pair of matched non-linear devices in the form of diodes 93 and 94 between terminal 82 and terminals 85 and 86. Diodes 91 and 92 form a series circuit between terminals 81 and 82 and are poled in the same direction. Diodes 92 and 94 form a series circuit between terminals 81 and 82 and are poled in the same direction between these terminals. These four diodes in the outer ring are poled in the same direction in a ring modulator arrangement and are referred to in the trade as a diode quad.

The inner or bottom ring BR of the frequency converter 59 further includes a pair of matched diodes 96 and 97 between terminal 83 and terminals 87 and 88 and a pair of matched diodes 98 and 99 between terminals 83 ad 84 and terminals 87 and 88. Diodes 96 and 98 form a series circuit between terminals 83 and 84 and are poled in the same direction. Diodes 97 and 99 form a series circuit between terminals 83 and 84 and are poled in the same direction between these terminals. These four diodes 96, 97, 98 and 99 in the inner ring are poled in the same direction in a ring modulator arrangement or a diode quad.

It is noted that in this arrangement each of the terminals 81, 82, 83 and 84 is electrically isolated from each of the terminals 85, 86, 87 and 88 by at least one diode.

When balanced signals are applied to the outer ring quad of matched diodes at terminals 81 and 82 from a signal being applied to the LO signal port 56, a virtual short is formed at terminals 85 and 86 by the symmetry of the diodes of the outer ring to the LO signal, thereby electrically isolating the LO signal from the IF port. Similarly, when balanced signals are applied to the inner ring of matched diodes at terminals 83 and 84 from a signal applied to the LO signal port, a virtual short is formed at terminals 87 and 88 by the symmetry of the diodes of the outer ring to the LO signal, again electrically isolating the LO signal from the IF port.

In a like manner the balanced signal at the terminals 81 and 83 resulting from an incoming RF signal is applied across a bridge comprised of diodes 91, 92, 96 and 97. Since diodes 91 and 92 are matched and diodes 96 and 97 are matched, then the bridge is balanced and terminals 87 and 88 are virtual shorts to the RF signals to electrically isolate the RF signal from the IF signal port. Similarly, the balanced signal at terminals 82 and 84 is applied across diodes 93, 94, 98 and 99 and, since diodes 93 and 94 are matched and diodes 98 and 99 are matched, then again the terminals 87 and 88 are virtually shorts to the RF signal and the RF signal is isolated from the IF signal port.

Referring now to the double slot balun 100 in the mixer, this balun is substantially the same as the balun shown in FIGS. 1-6 above described with some modifications described hereinafter. The corresponding parts of the double slot balun 100 with balun 10 shown in FIGS. 1-6 will bear corresponding numbers in the hundred series. The portions of the conductive sheets forming the input and output terminals bear corresponding numbers.

The double slot balun 100 shown has a first electric conductive sheet 115 and a second electric conductive sheet 116 that are in a coplanar relationship to one another and are spaced along opposed longitudinal edges 117 and 118, respectively, defining a tapered slot 119 that gradually increases in width from end portions or terminals 1 and 2 at the unbalanced end of the slot toward the end portions or terminals 3 and 4 at the balanced end of the slot 119. In turn, balun 100 also has a third conductive sheet 122 opposite conductive sheet 115 and a fourth conductive sheet 123 opposite conductive sheet 116. The third and fourth conductive sheets are spaced along opposed longitudinal edges 124 and 125, respectively, by a tapered slot 126 which corresponds in size and shape with slot 119. Each of the second and fourth conductive sheets has a tapered edge along one end of the substrate to accommodate the ground sheet for the coplanar wave guides described hereinafter.

For the transferring of electric or electromagnetic energy to and from the double slot line balun 100 in the mixer shown in FIGS. 18-22, there is provided a coplanar wave guide on each planar surface of the substrate. The coplanar wave guide on the top planar surface comprises an electric conductive strip 131 on the top planar surface of the substrate extending parallel to an edge of the first conductive sheet 115 in spaced relation thereto to form a gap 132, together with an electric conductive ground sheet 133 in parallel spaced relation to strip 131 which form another gap 134. A corresponding coplanar wave guide on the bottom planar surface includes an electric conductive strip 135 in parallel spaced relation to a side edge of the third conductive sheet 122 forming a gap 136 as well as a ground sheet 17 spaced from the wave guide strip 135 forming another gap 138 opposite gap 134.

As best seen in the circuit diagram, one end of strip 131 is connected to terminal 60 of the RF signal port 53 while the opposite end of strip 131 is connected to terminal 2 of the second conductive sheet 116. Terminal 1 of the first conductive sheet is connected to ground terminal 62. Each of the corners of strip 131, as well as those of the conductive sheets other than input and output terminals, is shown as connected to ground and this is accomplished by having the structure shown in FIGS. 18, 19 and 20 in a grounded metal housing or casing of open rectangular shape. The output terminal 4 of balun 100 is connected to terminal 81 of the top ring TR while the output terminal 3 is connected to terminal 82 of the top ring TR.

In a like manner one end of strip 132 is connected to terminal 61 of the RF signal port 53 while the opposite end is connected to terminal 2' of the fourth conductive sheet 123. Terminal 1' of the third conductive sheet is connected to ground terminal 62. Again each of the corners of the third and fourth conductive sheets 122 and 123 other than the input and output terminals is shown as connected to ground. The output terminal 4' is connected to terminal 83 of the bottom ring BR while the output terminal 3' is connected to terminal 84 of the bottom ring.

In the structure shown the first conductive sheet 115 and the second conductive sheet 116 are shown mounted on the top planar surface 112 at one end of the substrate 111 so as to be coplanar and the third conductive sheet 122 and fourth conductive sheet 123 are shown mounted on the bottom planar surface at one end of the substrate 111 so as to be coplanar.

With this arrangement it is noted that all connections from balun 100 to the frequency converter 59 are made on the same planar surface so that there are no electrical crossover connections from the top planar surface to the bottom planar surface, or vice versa.

Figures 18, 19, 20, 21, 22:
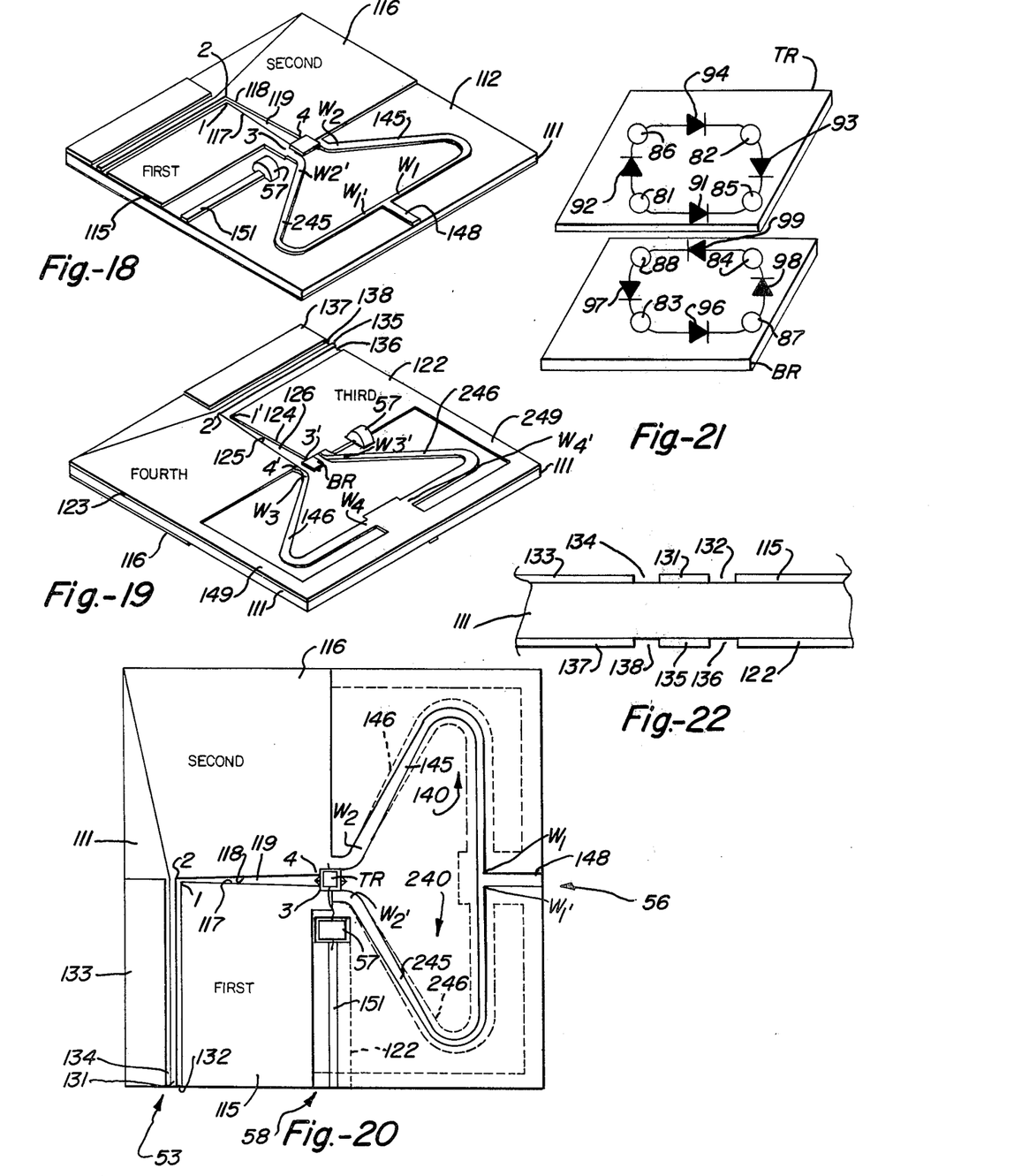
FIG. 18 is a top perspective view of the structure of a broadband mixer shown in FIG. 17.
FIG. 19 is a bottom perspective view of the mixer of FIG. 18.
FIG. 20 is an enlarged top plan view of the mixer shown in FIGS. 18 and 19.
FIG. 21 is a perspective view showing the arrangement of the two diode rings in the mixer shown in FIGS. 17-20.
FIG. 22 is an end elevational view showing the end of the coplanar wave guide feed portion of the mixer of FIGS. 18-20.
Figure 23:
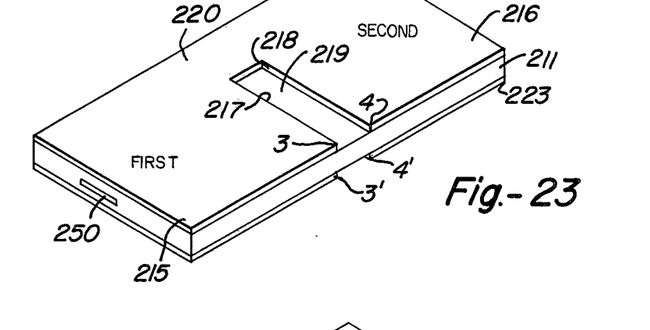
FIG. 23 is a top perspective view of a double slot balun with a strip transmission line feed.
Figure 24:
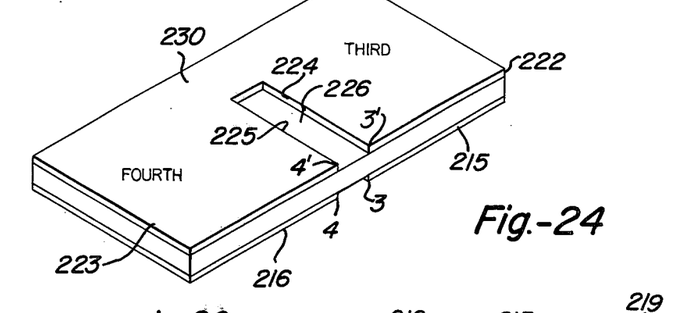
FIG. 24 is a bottom perspective view of the device of FIG. 23.
Figure 25:
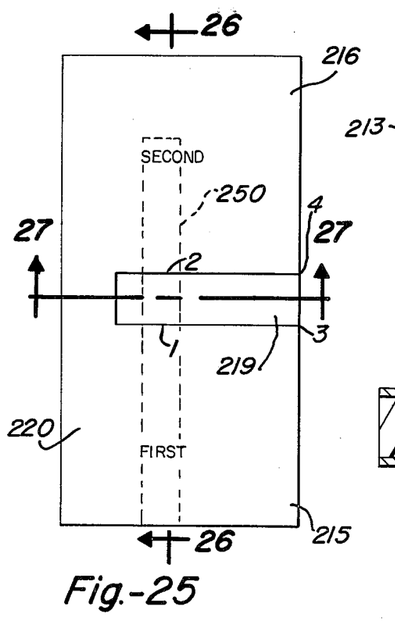
FIG. 25 is a top plan view of the double slot balun with a strip transmission line feed shown in FIG. 23.
Figure 26:
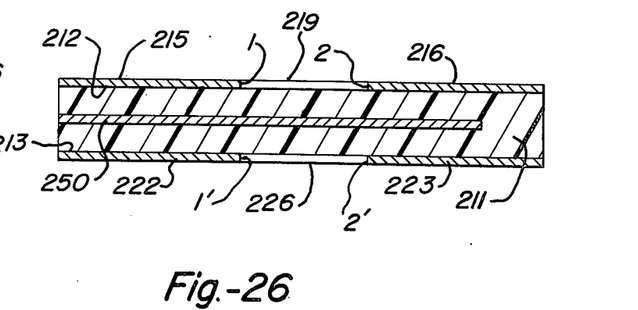
FIG. 26 is a sectional view taken along lines 26—26 of FIG. 25.
Figure 27:
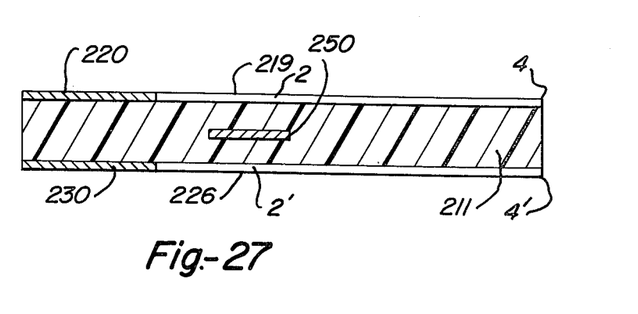
FIG. 27 is a sectional view taken along lines 27—27 of FIG. 25.

With reference to FIGS. 18-20, the balun transformer 57 is shown mounted in a slot in the substrate adjacent an inside edge of the first and third conductive sheets. A conductive strip 151 is mounted on the top surface of the substrate and extends along the inside edge of the first sheet 115 and connects to the LO port 58. It is noted that sheet 122 overlaps strip 151.

Referring again to the circuit diagram, balun 140 has a conductive strip 145 with end W1 connected to terminal 63 of port 53 and end W2 connected to terminal 81 of top ring TR. Conductive strip 146 has end W4 connected to ground at terminal 64 and end W3 connected to terminal 83 of the bottom ring BR. Balun 240 has conductive strip 245 with end W1' connected to terminal 63 of port 53 and end W2' connected to terminal 82 of top ring TR. Conductive strip 246 has end W4' connected to ground terminal 64 and end W3' connected to terminal 84 of bottom ring BR.

In the structure shown the conductive strips 145 and 245 are mounted on the top planar surface 112 of the substrate opposite the second conductive sheet 116 and the first conductive sheet 115, respectively, with strips 145 and 245 being disposed on opposite sides of a longitudinal center line of the substrate. Each of these conductive strips 145 and 245 is arranged along a curve rather than a straight line to shorten the length of the substrate. A connector strip 148 on the top surface connects the ends W1 and W1' together and provides a connecting lead.

End W2 is shown connected to sheet 116 at terminal 4 and end W2' is shown connected to sheet 115 at terminal 3. These connections are made by forming the strips and sheets out of a one-piece metal foil such as copper foil.

The conductive strips 146 and 246 are also curved and are disposed on the bottom planar surface 113 opposite and alined with strips 145 and 245, respectively. A ground strip 149 is mounted on the bottom planar surface and extends between one corner of sheet 123 and terminals W4 and W4'. A similar ground strip 249 is mounted on the bottom planar sheet and extends between a corner of sheet 122 and terminals W4 and W4'. End W3 is shown connected to terminal 4' and end W3' is shown connected to terminal 3' by integral strips on the substrate.

Again it is noted that in this arrangement all connections from baluns 140 and 240 to the frequency converter 59 are made on the same planar surface with no cross-over connections from top to bottom, or vice versa.

The RF and LO ports 53 and 56 are electrically isolated from one another by the manner in which the terminal pairs opposite the signal port side of the baluns are cross-connected. Specifically, terminals 4 and 3 of balun 100 are connected by separate lines to terminals W2 and W2', respectively, of baluns 140 and 240, and terminals 3' and 4' of balun 100 are connected by separate lines to terminals W3' and W3, respectively, of baluns 240 and 140. If, for example, a voltage of +2E were applied to the LO port 56, this voltage is divided and a +E voltage would appear at terminals W2 and W2' which are connected to terminals 4 and 3, respectively, placing a voltage of like amplitude and phase on terminal pairs 4 and 3 opposite the signal port side of balun 100. A −E voltage would appear at terminals W3 and W3' which are connected to terminals 4' and 3', respectively, also placing a voltage of like amplitude and phase on terminal pairs 4' and 3' opposite the signal port side of balun 100. In a like manner, when a voltage or signal is applied to RF signal port 53 these cross-connections place the proper signal on the terminal pairs of baluns 140 and 240 to prevent RF signals from appearing at the LO signal port. The application then of a signal of like polarity and amplitude to a pair of terminals on one side of the balun results in a canceling of the signals at the terminals on the opposite side or signal port side due to the operation of the balun.

An alternative device for transferring electric energy to and from the double slot balun is a strip transmission line as is illustrated in FIGS. 23-27. The modified double slot balun shown in FIGS. 23-27 is designated by numeral 200, which is substantially the same as the balun 10 shown in FIGS. 1-6 with some modifications described hereinafter. The corresponding parts of the double slot balun 200 with balun 10 will bear corresponding numbers in the two hundred series. The portions of the conductive sheets forming the terminals bear corresponding numbers.

In this form there is provided a dielectric substrate 211 wtih a top planar surface 212 and a bottom planar surface 213. A first conductive sheet 215 and a secondary conductive sheet 216 are disposed on the top planar surface 212 of the substrate, with sheets 215 and 216 having spaced longitudinal edges 217 and 218, respectively, defining a first slot 219 of uniform width throughout its length. In this form the first and second conductive sheets are joined by a back sheet portion 220 so that in effect they are a part of an integral sheet with a center slot 219 formed therein.

In turn, a third conductive sheet 222 and a fourth conductive sheet 223 are provided on the bottom planar surface 213 of the substrate with sheet 222 having a longitudinal edge 224 and sheet 223 a longitudinal edge defining a second slot 226. Again the third and fourth conductive sheets are joined by a back sheet portion 223. In this form a transverse electric conductive strip 250 is embedded in the substrate midway between the conductive sheets on the top planar surface and the third and fourth conductive sheets on the bottom planar surface. The longitudinal center line of this strip 250 extends at right angles to the slots 219 and 226 and intersects the slots adjacent the inner end to provide input terminals 1 and 2 at one end of the slot and output terminals 3 and 4 at the opposite end of the slot on the top surface and provide input terminals 1' and 2' at one end of the slot and output terminals 3' and 4' at the opposite end of the slot on the bottom surface.

Mixer Operation

The signals input to each of baluns 100, 140 and 240 via their associated ports are unbalanced to ground signals and the signals at the terminals on the opposite side of these baluns are balanced to ground signals. Each of these baluns provides an output signal on the pair of terminals opposite the signal port side that is of equal amplitude but 180° out of phase with one another. For example, the signal to terminal 3 has the same amplitude but is 180° out of phase with the signal at terminal 4. This results in the application of balanced to ground RF and LO signals to the terminals 81, 82, 83 and 84 of the double balanced bridge arrangement. This double balanced bridge arrangement, when driven by a sufficiently large local oscillator signal, allows a symmetrical bi-polar commutation of the RF signal to terminals 85, 87, 88 and 86, which is still a balanced to ground IF signal at the diodes. Balun 57 provides an unbalanced IF signal at the terminals 65 and 66 of the IF signal port 58. The balun 17 being of the ferrite core type extends the low frequency range.

The foregoing described double slot coplanar conductor baluns have been found to provide an extremely wide or broadband frequency response from about 1 to 20 GHz. The impedance transformation is adjustable by tapering the slot and can transform impedances within a range of 5 to 1. The arrangement of coplanar conductive sheets facilitates a cross-connection for converting from a four-terminal balanced structure to a three-terminal center-tapped balanced structure. The construction is compatible with microwave planar circuitry. The mixer exhibits a low standing wave ratio and is suitable for being fed by one of several techniques. The structure is readily adapted to be connected to mixer diode rings with no cross-over wires. The electromagnetic power is applied to coplanar sheets rather than parallel-spaced sheets, providing a field distribution in a planar direction. Finally, this device provides two in-phase outputs.

The constant impedance parallel spaced conductor balun as above described has been found to provide an extremely wide bandwidth or frequency response from about 0.1 GHz to 24 GHz. This balun provides a one-to-one impedance transformation and also has a low voltage standing wave ratio. The constant impedance balun is compatible with planar microwave circuitry including balanced doublers, balanced amplifiers, balanced antennas, and mixers. The cosine taper has been found to provide an equal ripple high-pass structure. The constant impedance balun of the present invention has good performance substantially below its quarter wavelength point. The preferred length of the two conductive strips of the constant impedance balun is a quarter wavelength for the lowest operating frequency, but usable performance is attained to frequencies corresponding to the 1/40 wavelength point. Usable balun performance is attained with a structure that is relatively short in terms of wavelength and has the virtues of giving both good low frequency response and high frequency response that is not restricted by excessive line losses.

The broadband mixer above described exhibits extremely wide bandwidth characteristics for high level inputs, has a low conversion loss and low standing wave ratios typically below two-to-one. This mixer has good balance and good isolation between ports throughout its operational bandwidth. All ports afford a good match to 50 ohms. The isolation characteristics are typically better than 20 db and nearer to 30 db in the significant portions of the operating band. This mixer then provides high performance, is small in size, relatively lightweight and durable, and lends itself to many applications.

Although the present invention has been described with a certain degree of particularity, it is understood that the present disclosure has been made by way of example and that changes in details of structure may be made without departing from the spirit thereof.

What is claimed is:

1. A double slot balun comprising:
   first and second conductive sheets disposed in a substantially coplanar relation to one another having spaced, opposed, longitudinal edges defining a first slot; and
   third and fourth conductive sheets disposed in a substantially coplanar relation to one another and disposed in a spaced, superposed and electrically insulated relation to said first and second coplanar conductive sheets, said third and fourth conductive sheets having spaced, opposed, longitudinal edges defining a second slot opposite said first slot for transforming unbalanced signals applied simultaneously to a common end of said first and second slots to a balanced signal at the opposite end of said first and second slots.

2. A double slot balun as set forth in claim 1 wherein said first and third conductive sheets are opposite one another and are of a corresponding size and shape.

3. A double slot balun as set forth in claim 1 wherein said second and fourth conductive sheets are opposite one another and are of a corresponding size and shape.

4. A double slot balun as set forth in claim 1 wherein said first and second slots are of a substantially uniform width throughout their lengthwise extent and are of a corresponding width and length.

5. A double slot balun as set forth in claim 1 wherein said first and second slots are tapered along their lengthwise extent and are of a corresponding width and length.

6. A double slot balun as set forth in claim 1 further including means for transferring electric energy to and from common ends of said first and second slots.

7. A double slot balun as set forth in claim 6 wherein said means for transferring is in the form of a coplanar wave guide.

8. A double slot balun as set forth in claim 6 wherein said means for transferring is in the form of a strip transmission line.

9. A double slot balun as set forth in claim 1 wherein said first conductive sheet and said third conductive sheet are electrically connected to one another.

10. A double slot balun as set forth in claim 1 wherein said first and third conductive sheets have the same polarities and said second and fourth conductive sheets have the same polarities and are opposite the polarities of said first and third conductive sheets.

11. A double slot transmission line balun comprising:
a dielectric substrate having two opposed, spaced, planar surfaces;
first and second coplanar, conductive sheets on one planar surface of said substrate, said conductive sheets having spaced, opposed, longitudinal edges defining a first slot, said first and second conductive sheets at one end of said first slot providing a first pair of terminals, said first and second conductive sheets at the opposite end of said first slot providing a second pair of terminals;
third and fourth coplanar, conductive sheets on the other planar surface of said substrate, said third and fourth conductive sheets having spaced, opposed, longitudinal edges defining a second slot, said third and fourth coplanar conductive sheets each defining a third pair of terminals common with said first pair of terminals, said third and fourth conductive sheets at the opposite end of said slot defining a fourth pair of terminals common with said second pair of terminals for transforming unbalanced signals applied simultaneously at two of said common pairs of terminals to balanced, in-phase signals at the other of said two common pairs of terminals; and
means for transferring electric energy to and from said first and second slots at two common pairs of said terminals.

12. A double slot transmission line balun as set forth in claim 11 wherein said means for transferring electric energy is in the form of a coplanar wave guide on each planar surface of said substrate with said coplanar wave guides being disposed opposite one another, each said coplanar wave guide including a first conductive strip connected at one end to an associated of one of said second and fourth conductive sheets at said one end of the first and second slots and extending in spaced parallel relation to a longitudinal edge of an associated of one of said first and fourth conductive sheets at right angles to said first and second slots to form a transfer slot in communication with the associated of said first and second slots, and a ground sheet on each of said planar surfaces disposed on the opposite side of said first conductive strip in spaced parallel relation thereto to form another slot on each of said planar surfaces.

13. A double slot transmission line balun as set forth in claim 12 wherein said means for transferring electric energy is in the form of a strip transmission line including a transverse conductive strip in said substrate extending at right angles to said first and second slots, the longitudinal center line of the transverse conductive strip intersecting said first and second slots adjacent said one end thereof at a point between said first and second slots to provide said first and third pairs of terminals.

14. A constant impedance balun comprising:
a first conductive strip having a first selected width at one end and a second selected width at an opposite end; and
a second conductive strip in alined, spaced, superposed, electrically insulated relation to said first conductive strip, said second conductive strip having a third selected width at one end in opposed relation to the end of said first conductive strip having said second selected width, said third selected width being equal to said second selected width, said second conductive strip having a fourth selected width at the opposite end in opposed relation to the end of said first conductive strip having said first selected width, said second conductive strip varying in width according to a selected taper increasing in width toward the end having said fourth selected width, the taper of said first conductive strip decreasing in width toward the end having said first selected width in relation to the selected taper of the second conductive strip such that the first and second conductive strips provide the same impedance at any point along the length of said conductive strips for transforming at an impedance transformation ratio of one-to-one an unbalanced signal applied to the ends of said first and second conductive strips having said first and said fourth widths to balanced signals at the opposite ends of said conductive strips having said second and third selected widths.

15. A constant impedance balun as set forth in claim 14 wherein said selected taper for said second conductive strip substantially follows a cosine curve and increases in width from said third selected width to said fourth selected width with said fourth selected width being the maximum width for both of said conductive strips.

16. A constant impedance balun as set forth in claim 14 wherein said selected taper for said second conductive strip substantially follows a straight line taper and increases in width from said third selected width to said fourth selected width.

17. A constant impedance balun as set forth in claim 14 wherein said selected taper for said second conductive strip substantially follows an exponential curve taper and increases in width from said third selected width to said fourth selected width.

18. A constant impedance balun as set forth in claim 14 wherein the length of said first and second conductive strips is that of a quarter wavelength for the lowest operating frequency.

19. A constant impedance balun as set forth in claim 14 wherein said first selected width is selected for a particular unbalanced planar transmission line having a particular characteristic impedance.

20. A constant impedance balun as set forth in claim 19 wherein said second and third selected widths are for a balanced parallel plate transmission line having said same characteristic impedance.

21. A constant impedance balun as set forth in claim 20 wherein said fourth selected width is selected so that said first and fourth selected widths provide said same characteristic impedance.

22. A constant impedance transmission line balun for use between an unbalanced planar transmission line and a balanced parallel plate transmission line and the like comprising:

a dielectric substrate having two opposed spaced planar surfaces;

a first conductive strip on one of said surfaces of said substrate, said first conductive strip having a first selected width at an unbalanced end and a second selected width at a balanced end opposite said unbalanced end; and a second conductive strip on the other surface of said substrate opposite said first conductive strip and alined with said first conductive strip, said second conductive strip having a third selected width at a balanced end in opposed relation to the end of said first conductive strip having said second selected width, said third selected width being equal to said second selected width, said second conductive strip having a fourth selected width at an unbalanced end in opposed relation to the end of said first conductive strip having said first selected width, said second conductive strip increasing in width toward the unbalanced end having said fourth selected width along a preselected fixed curve increasing in width toward the end having said fourth selected width, and the width of said first conductive strip from said first width to said second width being selected in relation to the selected taper of said second conductive strip and decreasing in width toward the unbalanced end having said first selected width such that the first and second conductive strips provide the same impedance at any point along the length of said conductive strips for transforming at an impedance transformation ratio of one-to-one an unbalanced signal applied to the ends of said first and second conductive strips having said first and said fourth widths to balanced signals at the opposite ends of said conductive strips having said second and third selected widths.

23. A broadband mixer comprising:

a double slot balun having a first pair of conductive sheets disposed in a substantially coplanar, electrically insulated relation to one another defining a first slot and a second pair of conductive sheets disposed in a substantially coplanar, electrically insulated relation to one another defining a second slot opposite and spaced from said first slot, said double slot balun being coupled to a first signal port for converting an unbalanced first signal applied to said first signal port to a balanced first signal;

a pair of constant impedance baluns each having a pair of spaced, alined, superposed, electrically insulated conductive strips, one of said conductive strips being tapered in relation to another to provide a constant impedance at any point along the length of said pair of conductive strips, said pair of constant impedance baluns being coupled to a second signal port for converting an unbalanced second signal applied to said second signal port to a balanced second signal, said double slot balun being connected to said pair of constant impedance baluns so that their respective signals do not pass to an opposite signal port;

third balun means coupled to a third signal port; and frequency converting means having a least a first set of terminals and a second set of terminals to which are applied said balanced first signal and said balanced second signal, and a third set of terminals, said frequency converting means including an arrangement of non-linear devices associated with said first, second and third sets of terminals for converting said balanced first and second signals to a balanced third signal at said third set of terminals that is conducted via said third balun means to produce an unbalanced third signal at said third signal port, said non-linear devices electrically isolating first and second signals at said first and second signal ports from said third signal port.

24. A broadband mixer as set forth in claim 23 wherein all of the electric connections between said double slot balun and said frequency converting means and said pair of constant impedance baluns and said frequency converting means are made in substantially the same plane.

25. A broadband mixer as set forth in claim 23 wherein said conductive sheets and said conductive strips are mounted on a single unitary dielectric substrate having a pair of opposed planar surfaces in different planes.

26. A broadband mixer as set forth in claim 25 wherein said frequency converting means includes:

a first pair of matched diodes coupled between one of said first set of terminals and said third set of terminals and a second pair of matched diodes coupled to the other of said first set of terminals and said third set of terminals, said first and second pairs of matched diodes being poled in the same direction in a first ring arranged on one planar surface of the supporting substrate;

each of said first and second pairs of matched diodes arranged as two series circuits of two diodes each between said first set of terminals and said third set of terminals, each diode in each of said series circuits being poled in the same direction for current flow in the same direction; and a third pair of matched diodes coupled between one of said second set of terminals and said third set of terminals and a fourth pair of matched diodes coupled to the other of said second set of terminals and said third set of terminals, said third and fourth pairs of matched diodes being poled in the same direction in a second ring arranged on the other planar surface of the supporting substrate.

27. A broadband mixer as set forth in claim 26 wherein said first pair of conductive sheets, a similar conductive strip of each of said pair of constant impedance baluns, and said first ring are on a common planar surface.

* * * * *